United States Patent
Ruoff et al.

(10) Patent No.: US 9,785,052 B2
(45) Date of Patent: Oct. 10, 2017

(54) OPTICAL SYSTEM OF A MICROLITHOGRAPHIC PROJECTION EXPOSURE APPARATUS AND METHOD OF REDUCING IMAGE PLACEMENT ERRORS

(71) Applicant: Carl Zeiss SMT GmbH, Oberkochen (DE)

(72) Inventors: Johannes Ruoff, Aalen (DE); Jens Timo Neumann, Aalen (DE); Joerg Zimmermann, Aalen (DE); Dirk Hellweg, Aalen (DE); Dirk Juergens, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 742 days.

(21) Appl. No.: 13/792,599

(22) Filed: Mar. 11, 2013

(65) Prior Publication Data
US 2013/0188160 A1 Jul. 25, 2013

Related U.S. Application Data

(63) Continuation of application No. PCT/EP2010/005901, filed on Sep. 28, 2010.

(51) Int. Cl.
*G03B 27/68* (2006.01)
*G03F 7/20* (2006.01)

(52) U.S. Cl.
CPC ...... *G03F 7/70141* (2013.01); *G03F 7/70116* (2013.01); *G03F 7/70466* (2013.01); *G03F 7/70566* (2013.01); *G03F 7/70633* (2013.01)

(58) Field of Classification Search
CPC ............ G03F 7/70116; G03F 7/70141; G03F 7/70466; G03F 7/70566; G03F 7/70633
(Continued)

(56) References Cited

U.S. PATENT DOCUMENTS 6,310,679 B1 10/2001 Shiraishi
6,404,482 B1 6/2002 Shiraishi
(Continued)

FOREIGN PATENT DOCUMENTS

EP 1796142 A1 6/2007
JP H07-130633 5/1995
(Continued)

OTHER PUBLICATIONS

International Search Report for corresponding PCT Application No. PCT/EP2010/005901, 3 pages, dated May 4, 2012.
(Continued)

*Primary Examiner* — Deoram Persaud
(74) *Attorney, Agent, or Firm* — Fish & Richardson P.C.

(57) ABSTRACT

A method of reducing image placement errors in a microlithographic projection exposure apparatus includes providing a mask, a light sensitive layer and a microlithographic projection exposure apparatus which images features of the mask onto the light sensitive surface using projection light. Subsequently, image placement errors associated with an image of the features formed on the light sensitive surface are determined either by simulation or metrologically. Then an input state of polarization of the projection light is changed to an elliptical output state of polarization which is selected such that the image placement errors are reduced.

20 Claims, 11 Drawing Sheets

(58) Field of Classification Search
USPC .............................................. 355/52, 67, 71
See application file for complete search history.

(56) References Cited

U.S. PATENT DOCUMENTS

| | | | |
|---|---|---|---|
| 2001/0052968 A1* | 12/2001 | Shiozawa | G03F 7/70066 355/53 |
| 2004/0263810 A1 | 12/2004 | Kirchner et al. | |
| 2004/0263816 A1 | 12/2004 | Van Dam | |
| 2005/0146704 A1* | 7/2005 | Gruner et al. | 355/71 |
| 2005/0206871 A1* | 9/2005 | Tsuji | G03F 7/701 355/71 |
| 2006/0192149 A1 | 8/2006 | Van Dam et al. | |
| 2007/0146676 A1* | 6/2007 | Tanitsu | G03F 7/70108 355/71 |
| 2007/0188730 A1* | 8/2007 | Takeuchi et al. | 355/71 |
| 2008/0043236 A1* | 2/2008 | Kaise et al. | 356/364 |
| 2009/0002673 A1* | 1/2009 | Shinoda | G03F 7/70058 355/71 |
| 2009/0015811 A1* | 1/2009 | Kawakami | G03F 7/70958 355/67 |
| 2009/0115991 A1 | 5/2009 | Fiolka | |
| 2011/0141451 A1* | 6/2011 | Yamaguchi | G01D 5/38 355/77 |

FOREIGN PATENT DOCUMENTS

| | | |
|---|---|---|
| JP | 2006-237616 | 9/2006 |
| JP | 2007-194537 | 8/2007 |
| JP | 2008-270502 | 11/2008 |
| JP | 2009-544146 | 12/2009 |
| WO | 2005031467 A2 | 4/2005 |

OTHER PUBLICATIONS

Written Opinion of the International Searching Authority for corresponding PCT Application No. PCT/EP2010/005901, 5 pages, dated May 4, 2012.

Hendrickx et al., "Image placement error: closing the gap between overlay and imaging", J. Mi-crolith., Microsyst. 4(3), 033006, Jul.-Sep. 2005.

Ruoff et al., "Orientation Zernike polynomials: a useful way to describe the polarization effects of op-tical imaging systems", J. Micro/Nanolith. MEMS MOEMS 8(3), 031404 (Jul.-Sep. 2009).

Japanese Office Action, with translation, for corresponding JP Appl No. 2013-530572, dated Sep. 3, 2013.

Taiwanese Office Action and Search Report, with translation thereof, for TW Appl No. 100134520, dated Mar. 14, 2016.

* cited by examiner

OPTICAL SYSTEM OF A MICROLITHOGRAPHIC PROJECTION EXPOSURE APPARATUS AND METHOD OF REDUCING IMAGE PLACEMENT ERRORS

CROSS-REFERENCE TO RELATED APPLICATION

The present application is a continuation of, and claims benefit under 35 USC 120 to, international application PCT/EP2010/005901, filed Sep. 28, 2010, which is incorporated herein by reference in its entirety.

FIELD

The disclosure generally relates to an optical system, in particular to an illumination system or a projection objective, of a microlithographic projection exposure apparatus. The disclosure further relates to a method of reducing image placement errors in such an apparatus.

BACKGROUND

Microlithography (also referred to as photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as ultraviolet light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask alignment stage for aligning the mask, a projection objective (sometimes also referred to as "the lens") and a wafer alignment stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply a scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection objective, for which usually $|\beta|<1$ holds, for example $|\beta|=\frac{1}{4}$.

An important goal in the development of projection exposure apparatus is to be able to lithographically define structures with smaller and smaller dimensions on the wafer. Small structures lead to a high integration density, which generally has a favorable effect on the performance of the microstructured components produced with the aid of such apparatus.

The minimum size of the features that can be lithographically defined is approximately proportional to the wavelength of the projection light. Therefore the manufacturers of such apparatus strive to use projection light having shorter and shorter wavelengths. The shortest wavelengths currently used are 248 nm, 193 nm and 157 nm and thus lie in the deep (DUV) or vacuum (VUV) ultraviolet spectral range. The next generation of commercially available apparatus will use projection light having an even shorter wavelength of about 13.5 nm which is in the extreme ultraviolet (EUV) spectral range. However, EUV apparatus are very expensive, and thus there is a desire to push the existing DUV and VUV technology to its limits.

One approach in doing so is the use of double patterning exposure technology (DPT). According to this technology, which is particularly useful for layers having a very high pattern density, a single layer is sequentially subjected to two separate exposure and etching steps. For example, a pattern of parallel lines may be lithographically defined and transferred to the layer by etching. This step is repeated, but with the line pattern being laterally displaced. Since the two line patterns interleave, the final line density in the layer is twice the density of the original line pattern. However, the use of this technology is particularly sensitive to overlay errors, because such errors directly translate into undesired line width variations. Since DPT is likely to be used more extensively in the future, the overlay error budget is expected to become significantly smaller.

The term overlay error originally related to the registration of adjacent patterned layers in the microstructured devices. If features that should be arranged one above the other are laterally displaced, this offset is referred to as overlay error. Meanwhile, the term overlay error has also become used to denote relative displacements of features within a single layer.

A more comprehensive understanding of overlay errors involves examining why and to which extent the images of the individual features are laterally displaced. In the case of DPT, no overlay error should be observed if the displacements of feature images that have been defined with different exposures are completely equal. Generally, however, the displacements are different at least to some extent, and thus overlay errors are the rule and not the exception.

For denoting the displacement of an individual feature image the term image placement error (IPE) is frequently used. The image placement error refers to the absolute displacement of a feature image in a layer, i.e. the deviation of the actual image placement from the ideal (desired) placement.

Various causes for image placement errors are known. Among them are alignment errors occurring in the mask and wafer stage. But also the projection objective of the apparatus contributes significantly to image placement errors. One commonly known image placement error is distortion. This aberration denotes an image placement error that depends on the field position and also feature orientation, but that is independent of the feature size and pitch. Distortion is the result of a tilt in the wavefront, which is associated with a particular field point, and is mathematically described by Zernike polynomials $Z_2$ and $Z_3$. There are several approaches to reduce the distortion of a projection objective, among them tilting and/or rotating the wafer and/or the mask, as it is described in US 2004/0263810 A1.

However, often there are also considerable contributions to image placement errors that are a result of other aberrations in the projection objective. It is known that higher asymmetric aberrations which are described by odd Zernike polynomials, for example by $Z_7$ or $Z_8$ (coma), may lead to significant image placement errors. These asymmetric aberrations may be a result of lens heating effects that asymmetrically change the optical properties of the lenses. In contrast to distortion, these contributions depend strongly not only on the orientation of the features, but also on their size and pitch and on the illumination setting. These parameters determine which light directions contribute to the image formation in the image plane of the projection objective, and thus which portions of the exit pupil of the projection objective are illuminated during an exposure. A more detailed discussion of these contributions can be found in an essay by E. Hendrickx et al. entitled "*Image placement error: closing the gap between overlay and imaging*", J. Microlith., Microsyst. 4(3), 033006, July-September 2005. This article discusses how image placement errors can be determined either computationally by applying suitable models, or metrologically using SEM measurements, for example.

Another cause for image placement errors is described the article J. Ruoff et al. entitled "*Orientation Zernike polynomials: a useful way to describe the polarization effects of optical imaging systems*", J. Micro/Nanolith. MEMS MOEMS 8(3), 031404 (July-September 2009). This article proposes the use of orientation Zernike polynomials (OZP) to describe the polarization properties of the pupil. It is predicted that odd OZP cause image placement errors.

So far, the typical approach for reducing image placement errors depending on feature pitch involves reducing the aberrations that cause the image placement errors. However, this is only feasible to certain extents.

SUMMARY

The disclosure provides an optical system of a microlithographic projection exposure apparatus which is capable of effectively reducing image placement errors, as well as a method of doing so.

In one aspect, the disclosure provides an optical system including a polarization adjustment device which is capable of changing an input state of polarization to different elliptical output states of polarization. The optical system further includes a control unit which controls the polarization adjustment device. The control unit is configured to: a) receive data relating to image placement errors occurring at a light sensitive surface on which features contained in a mask are imaged; and b) select the elliptical output state of polarization produced by the polarization adjustment device such that the image placement errors are reduced.

The disclosure is based on the realization that an image point on the light sensitive surface is laterally displaced if the projection light contributing to the formation of the image point is elliptically polarized. This displacement can be used to compensate image placement errors that may have been caused, for example, by higher asymmetric aberrations such as coma. The control unit then receives the data relating to the image placement errors and selects an elliptical output state of polarization from a plurality of available elliptical output states of polarization such that the image placement errors determined beforehand are at least substantially reduced.

Image placement errors caused by higher asymmetric aberrations such as coma depend, unlike distortion, strongly on the pitch of the features to be imaged on the light sensitive layer. When a mask pattern, which usually contains features having different pitches and orientations, is imaged on the light sensitive layer, the image placement error will thus be different for different features contained in the pattern. For that reason any image placement error compensation which is uniform for all features can only achieve a small corrective effect, or even no overall positive effect at all.

However, it has been discovered that also the image point displacement caused by an elliptical output state of polarization depends on the pitch and orientation of the features to be imaged. Although the pitch dependency will generally be different, it is often possible to achieve a significant reduction of pitch dependent image placement errors if the elliptical output state of polarization is suitably selected.

In some cases it may even be possible to achieve a significant reduction of image placement errors if the same elliptical output state of polarization is used for different masks. Generally, however, different mask patterns will involve different illumination settings, and this often involves a change of the elliptical output state of polarization.

Under certain conditions all the light, which contributes to the formation of an image point, may be in the same elliptical output state of polarization. In many cases, however, the elliptical output state of polarization will vary depending on the direction of the projection light when it converges towards a point on the light sensitive surface. This takes into account the fact that the image placement errors on the one hand and the polarization induced displacements on the other hand generally have different dependencies on feature pitch and orientation.

Such variations of the elliptical output state of polarization can be achieved best if the polarization adjustment device is arranged in or in close vicinity to a pupil surface of the optical system. If the optical system is an illumination system of the projection exposure apparatus, there are often two or even more pupil surfaces where the polarization adjustment device (or more than one polarization adjustment device) can be arranged. Often such a position is available in the vicinity of an optical integrator or within a field stop objective which images a field stop on the mask.

If the optical system is a projection objective of the projection exposure apparatus, there is at least one pupil surface available in which the polarization adjustment device may be arranged.

Due to the dependency of the polarization induced displacements on feature pitch and orientation it will often be advantageous to have a control unit that is configured to receive data relating to the pitch and orientation of the features to be imaged on the light sensitive layer. The control unit is then furthermore configured to select the elliptical output state of polarization depending on the pitch and orientation of the features. In this way displacements of image points can be produced that compensate to a large extent image placement errors.

The image placement errors may be determined by measurements or by simulations. If the image placement errors are determined by measurements, the control unit may be configured to receive these measurements data from a man machine interface or directly from a measurement apparatus. If the image placement errors are determined by simulation, the optical system may include a simulation unit which is configured to determine the image placement errors on the basis of input data relating to the pitch and orientation of the features and to an illumination setting used to illuminate the mask. These are the basic data which are used for the simulation unit to determine the image placement errors computationally.

Sometimes the image placement errors depend on the field position on the light sensitive surface even if the imaged features have an identical pitch and orientation. In such cases it may be envisaged to arrange the polarization adjustment device at a position which is close to a field plane of the optical system. Then also field dependencies of the image placement error can be corrected with the help of the polarization adjustment device. However, it may then be more difficult to achieve also a desired variation of the elliptical output state of polarization for different directions of the projection light.

As a polarization adjustment device any device may be used that is capable of transforming an input state of polarization to different elliptical output states of polarizations. In the simplest case the polarization adjustment device includes a retarder, for example a quarter-wave plate, which can be arranged in different rotational positions so that different elliptical output states of polarization can be produced if the input state of polarization is linear. However, in order to be able to be more flexible with regard to the elliptical output states of polarization that can be produced, more sophisticated devices may be used. Particularly suitable are those devices which are described in WO 2005/031467 A2 assigned to the applicant of the present application and whose full disclosure is incorporated herein by reference.

Generally the polarization adjustment device may include a birefringent optical member, because birefringence makes it possible to modify the state of polarization without incurring substantial light losses.

In one embodiment, the polarization adjustment device includes an exchange mechanism that is configured to insert one of a plurality of different birefringent optical members into a projection light beam path of the optical system.

Each optical member may include a plurality of uniaxial birefringent optical elements, wherein the optic axes of at least two optical elements have different orientations. With such optical members the output state of polarization can depend on the position where light passes through the optical member. If such an optical member is arranged in a pupil surface of the optical system, it is possible to produce elliptical output states of polarization that depend on the direction of the projection light when it converges towards a point on the light sensitive surface.

According to another embodiment, the polarization adjustment device includes an actuator that is configured to produce a variable stress distribution within the birefringent optical member. This embodiment exploits the physical effect of stress induced birefringence which is present in optical materials. With such a polarization adjustment device it is possible to produce a continuous range of locally varying output polarization distributions.

In one aspect, the disclosure provides a method which includes:
a) providing a mask containing features;
b) providing a light sensitive layer;
c) providing a microlithographic projection exposure apparatus which is configured to image the features onto the light sensitive surface using projection light;
d) determining image placement errors associated with an image of the features formed on the light sensitive surface;
e) changing an input state of polarization of the projection light to an elliptical output state of polarization which is selected such that the image placement errors determined in d) are reduced.

With regard to the advantages achieved with such a method reference is made to the above remarks relating to the optical system.

In one embodiment, the output elliptical state of polarization is selected in e) depending on the pitch and the orientation of the features to be imaged.

In another embodiment the elliptical output state of polarization has a pupil dependency, i.e. it varies depending on the direction of the projection light when it converges towards a point on the light sensitive surface.

According to another embodiment an intensity distribution in a pupil surface of an illumination system of the apparatus is symmetrical with regard to a plane of symmetry. A distribution of the handedness of the elliptical output states of polarization in this pupil surface is non-symmetrical with respect to this plane of symmetry. This takes into account the effect that the displacements, which are produced if the intensity distribution in the pupil surface is symmetrical, will cancel each other out so that no net corrective effect remains. Only with a non-symmetrical distribution of the handedness of the elliptical output states of polarization such a mutual cancellation of the displacement can be avoided.

According to another embodiment, the state of polarization of projection light is changed before the projection light impinges on the mask.

According to another embodiment, the elliptical output state of polarization selected in e) is is the same for all field points on the light sensitive surface. According to a still further embodiment the elliptical output state of polarization selected in step e) is different for at least two field points on the light sensitive surface.

BRIEF DESCRIPTION OF THE DRAWINGS

Various features and advantages of the present disclosure may be more readily understood with reference to the following detailed description taken in conjunction with the accompanying drawings, in which.

DESCRIPTION OF THE PREFERRED EMBODIMENTS

I

General Construction of Projection Exposure Apparatus

Figure 1:
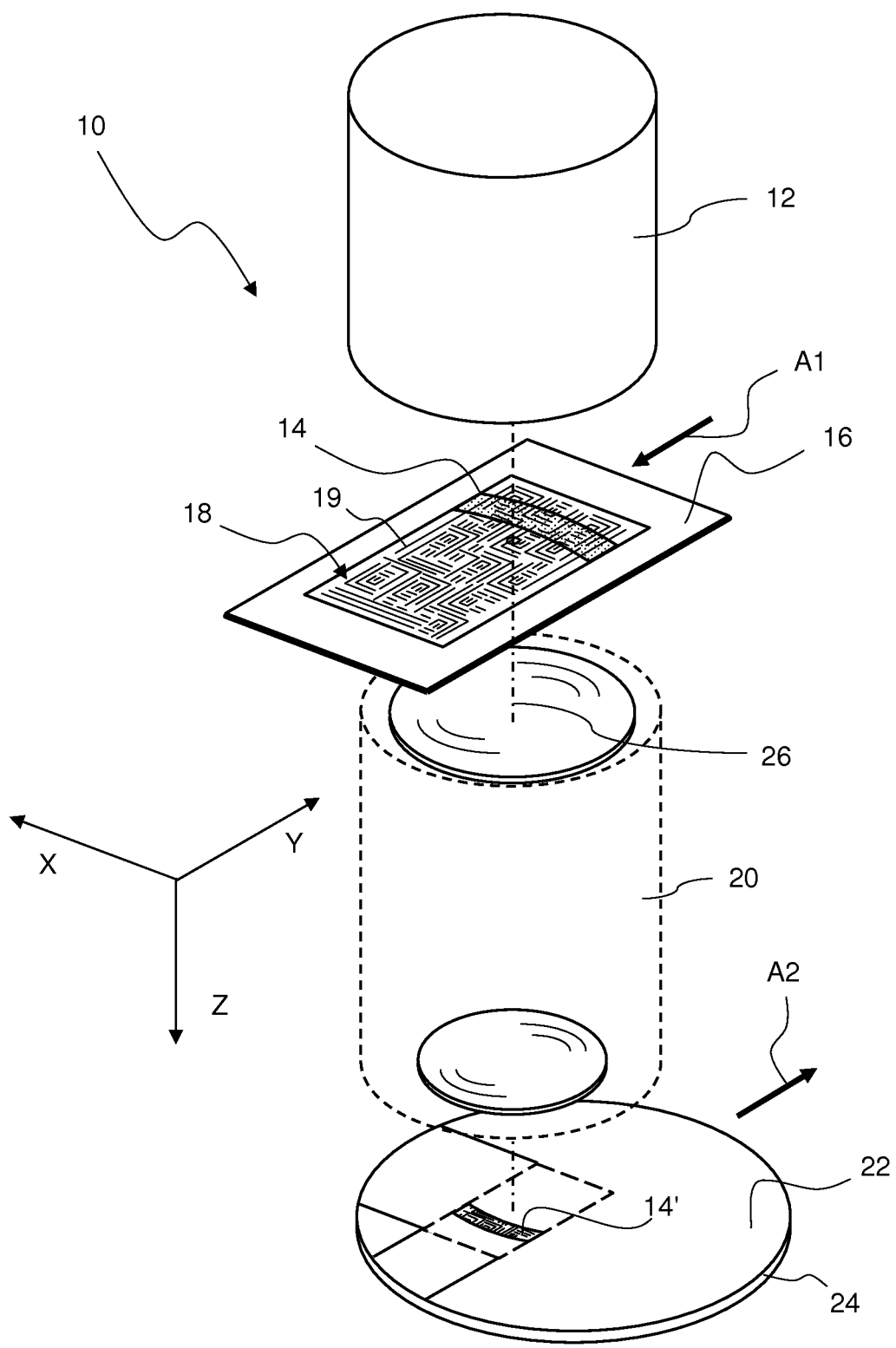
FIG. 1 is a perspective schematic view of a projection exposure apparatus in accordance with the present disclosure.

FIG. 1 is a perspective and highly simplified view of a projection exposure apparatus 10 including an illumination system 12 which produces a projection light beam. The projection light beam illuminates a field 14 on a mask 16 containing a pattern 18 formed by a plurality of small features 19 that are indicated in FIG. 1 as thin lines. In this embodiment the illuminated field 14 has the shape of a ring segment. However, other shapes of the illuminated field 14, for example rectangles, are contemplated as well.

A projection objective 20 images the pattern 18 within the illuminated field 14 onto a light sensitive layer 22, for example a photoresist, which is supported by a substrate 24. The substrate 24, which may be formed by a silicon wafer, is arranged on a wafer stage (not shown) such that a top surface of the light sensitive layer 22 is precisely located in an image plane of the projection objective 20. The mask 16 is positioned using a mask stage (not shown) in an object plane of the projection objective 20. Since the latter has a magnification β with |β|<1, a minified image 14' of the pattern 18 within the illuminated field 14 is projected onto the light sensitive layer 22.

During the projection the mask 16 and the substrate 24 move along a scan direction which coincides with the Y direction indicated in FIG. 1. The illuminated field 14 then scans over the mask 16 so that patterned areas larger than the illuminated field 14 can be continuously projected. The ratio between the velocities of the substrate 24 and the mask 16 is equal to the magnification β of the projection objective 20. If the projection objective 20 inverts the image (β<0), the mask 16 and the substrate 24 move in opposite directions, as this is indicated in FIG. 1 by arrows A1 and A2. However, the present disclosure may also be used in stepper tools in which the mask 16 and the substrate 24 do not move during projection of the mask.

II

General Construction of Illumination System

Figure 2:
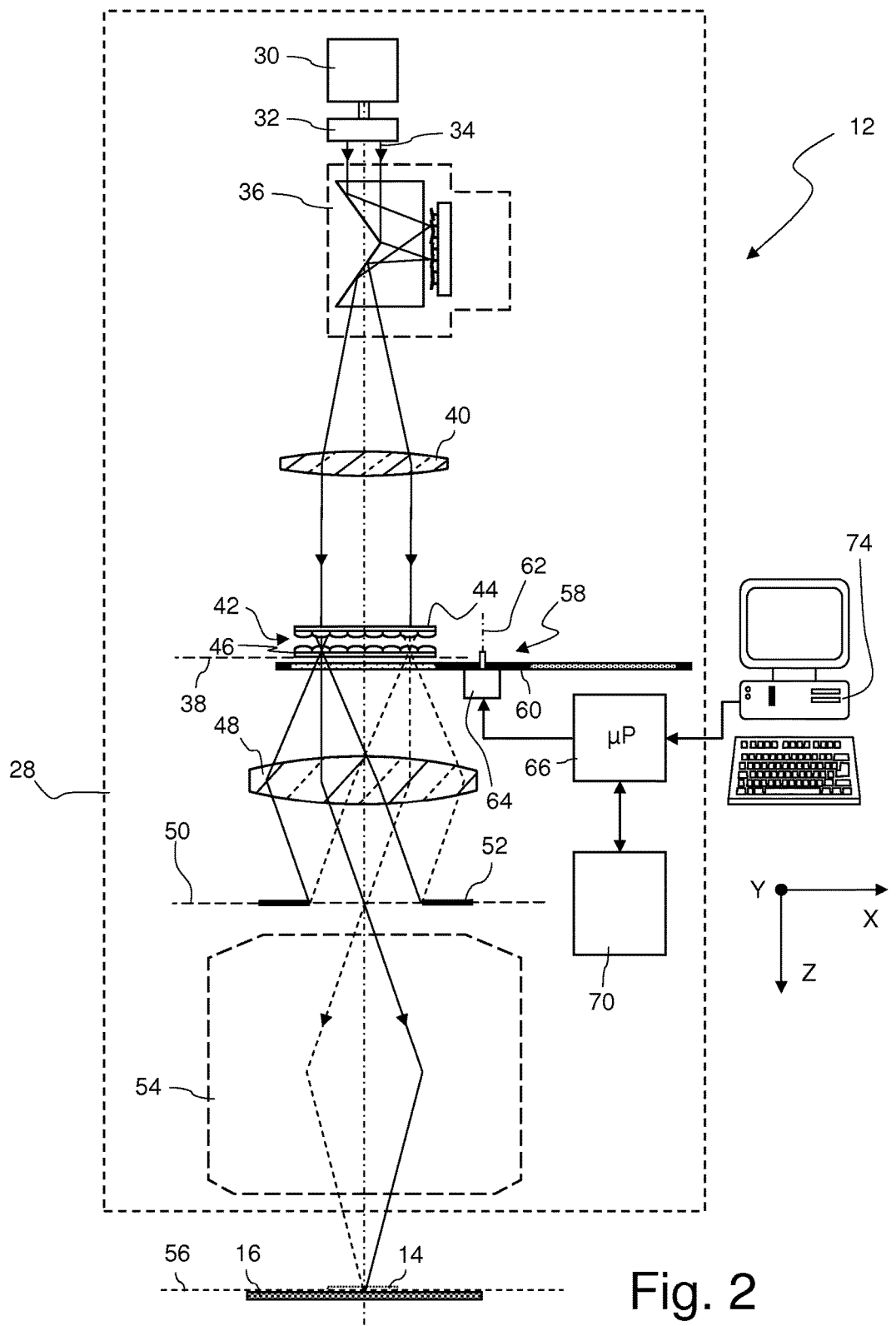
FIG. 2 is a simplified meridional section through an illumination system contained in the apparatus shown in FIG. 1.

FIG. 2 is a meridional section through the illumination system 12 shown in FIG. 1. For the sake of clarity, the illustration of FIG. 2 is considerably simplified and not to scale. This particularly implies that different optical units are represented by one or very few optical elements only. In reality, these units may include significantly more lenses and other optical elements.

The illumination system 12 includes a housing 28 and a light source 30 that is, in the embodiment shown, realized as an excimer laser. The light source 30 emits projection light having a wavelength of about 193 nm. Other types of light sources 30 and other wavelengths, for example 248 nm or 157 nm, are also contemplated.

In the embodiment shown, the projection light emitted by the light source 30 enters a beam expansion unit 32 in which the light beam is expanded. The beam expansion unit 32 may include several lenses or may be realized as a mirror arrangement, for example. The projection light emerges from the beam expansion unit 32 as an almost collimated beam 34.

The projection light beam 34 then enters a spatial light modulating unit 36 that is used to produce a variable intensity distribution at a pupil surface 38. Various embodiments of the spatial light modulating unit 36 will be described in more detail below with reference to FIGS. 3 to 9.

Between the spatial light modulating unit 36 and the pupil surface 38 a condenser 40 is arranged which transforms the different directions of the light rays emerging from the spatial light modulating unit 36 into different locations at the pupil surface 38. In other embodiments the condenser 40 is dispensed with so that the spatial light modulating unit 36 directly illuminates the pupil surface 38 in the far field.

In or in close vicinity to the pupil surface 38 an optical integrator 42 is arranged which includes two optical raster elements 44, 46 which may include arrays of cylindrical lenses or fly's eye lenses, for example. The optical integrator 42 produces a plurality of secondary light sources that each illuminate, via a further condenser 48, an intermediate field plane 50 in which a field stop 52 is arranged. The further condenser 48 assists in superimposing the light bundles, which have been emitted by the secondary light sources, in the intermediate field plane 80. Due to this superposition a very uniform illumination of the intermediate field plane 50 is achieved. The field stop 52 may include a plurality of moveable blades and ensures, to the extent desired, sharp edges of the illuminated field 14 on the mask 16.

A field stop objective 54 provides optical conjugation between the intermediate field plane 50 and a mask plane 56 in which the mask 16 is arranged. The field stop 52 is thus sharply imaged by the field stop objective 54 onto the mask 16.

III

Image Placement Error (IPE)

Figures 3, 4:
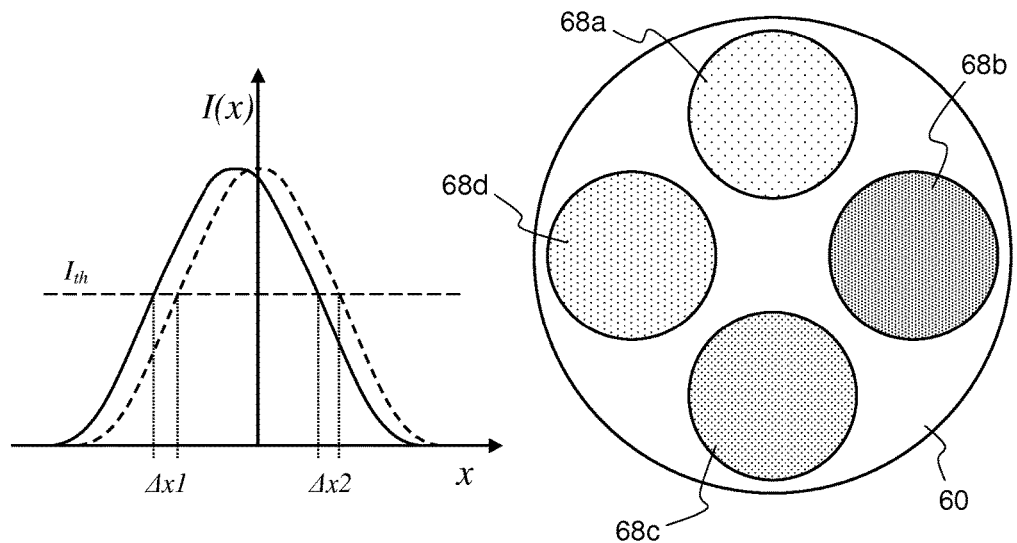
FIG. 3 is a graph showing an intensity distribution which is obtained if a sharply delimited line is imaged on a light sensitive surface with an image placement error.
FIG. 4 is a top view on a turntable supporting four birefringent members.

Because of diffraction and some other reasons, the features 19 that constitute the pattern 18 are not identically transferred to the light sensitive layer 22. FIG. 3 is a graph showing an exemplary intensity distribution I(x) along the x direction which is obtained if a sharply delimited line centered at x=0 is imaged on the light sensitive surface 22. As it is represented by the solid line in FIG. 3, the image is laterally blurred to an extent which depends, among others, on the width of the line, on the projection exposure apparatus 10 used for this purpose and on the operating conditions.

Despite this approximately bell-shaped intensity distribution the structure which will ultimately be obtained on the substrate 24 will be quite sharply delimited. This is due to the fact that the resist which is usually used as light sensitive surface 22 has a sharp exposure threshold $I_{th}$. If the intensity is above this threshold $I_{th}$, the resist is chemically modified, and if the intensity remains below this threshold $I_{th}$, no modification occurs. The borders of a later structure are thus defined by the intersection of the solid line with the horizontal line representing the threshold intensity $I_{th}$.

In FIG. 3 it has been assumed that an image placement error IPE has occurred so that a later structure is, in contrast to the feature that was imaged, not centered at x=0. Instead, there is a deviation between the actual placement of the structure from the ideal placement which would be caused by an intensity distribution that is represented in FIG. 3 by a broken line centered at Since an image displacement may be accompanied by an asymmetrical deformation of the intensity distribution I(x), the two points defining the lateral borders of the later structure are usually considered separately. In FIG. 3 the deviation of the left border is denoted by $\Delta x1$ and the deviation of the right border is denoted by $\Delta x2$. Then the image placement error IPE is defined as $$IPE=(\Delta x1-\Delta x2)/2 \quad (1)$$

Generally the IPE depends on the size, orientation and pitch of the features 19 to be imaged, and sometimes also on the location where the features 19 are positioned on the mask 16. This makes it difficult to reduce the IPE using the established approaches which have been developed for correcting aberrations in projection objectives.

IV

IPE Reduction

In the following an embodiment of the disclosure will be described with reference to FIGS. 2 and 4 to 8 in which a polarization adjustment device changes an input state of polarization to different elliptical output states of polarization. These output states of polarization are selected by a control unit such that image placement errors IPE are reduced.

Referring again to FIG. 2, the polarization adjustment device, which is denoted in its entirety by reference numeral 58, includes a turntable 60 which can be rotated around an axis 62 by an electric drive 64. The electric drive 64 is connected to the control unit denoted by 66.

Figures 5, 6:
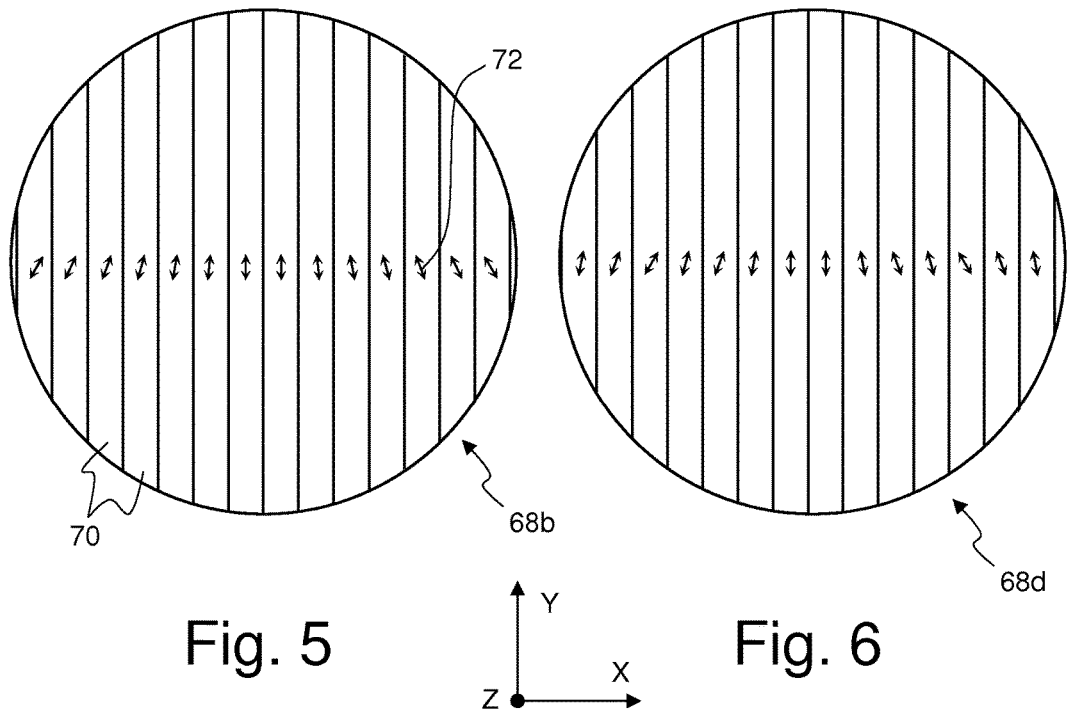
FIG. 5 is a top view on one of the birefringent members supported by the turntable shown in FIG. 4.
FIG. 6 is a top view on another one of the birefringent members supported by the turntable shown in FIG. 4.

FIG. 4 is a top view on the turntable 60. In this embodiment the turntable 60 has four openings into which different birefringent optical members 68a, 68b, 68c and 68d are inserted. In FIGS. 2 and 4 the birefringent members 68a to 68d are illustrated with different shades of gray indicating the different birefringent properties of the birefringent members 68a to 68d. However, these properties are not uniformly distributed over the area of the birefringent members 68a to 68d, as it might be suggested by the uniform shades of gray. Instead, each birefringent member 68a to 68d is assembled from a plurality of uniaxial birefringent optical elements 70, as it is shown in FIGS. 5 and 6 which are enlarged top views of the birefringent members 68b and 68d, respectively. The birefringent optical elements 70 are formed as narrow stripes or rods extending along the Y direction and having an optic axis which is represented in FIGS. 5 and 6 by a double arrow 72. The orientation of the optic axis 72 of adjacent birefringent optical elements 70 is generally different, as it is shown in FIGS. 5 and 6 in an exaggerated manner for the sake of clarity. As a result of this structure, the birefringent members 68a to 68d have basically the function of a wave plate having an optic axis which varies along the X direction.

For the other two birefringent members 68a and 68c the birefringent optical elements 70 extend along orthogonal directions so that the same variation along the X direction is achieved if these members are turned into the beam path of the projection light.

Figure 7:
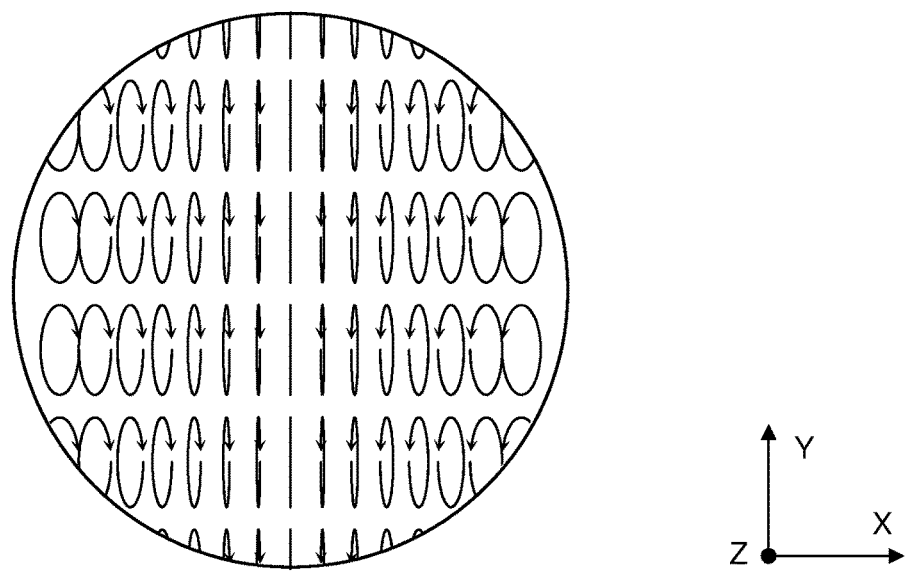
FIG. 7 illustrates a polarization distribution produced by the birefringent member shown in FIG. 5.
Figure 8:
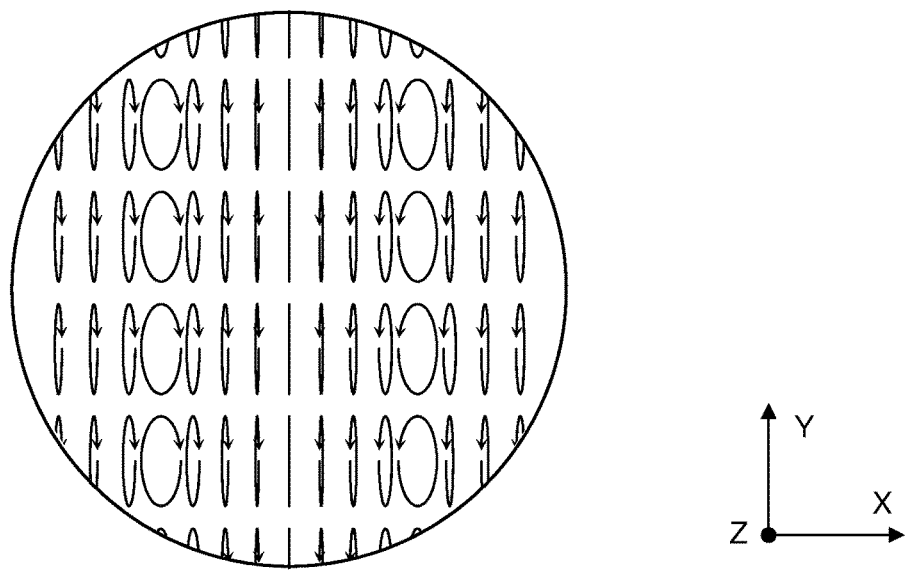
FIG. 8 illustrates a polarization distribution produced by the birefringent member shown in FIG. 6.

FIGS. 7 and 8 show polarization distributions which may be achieved with the help of the birefringent members 68b and 68d, respectively, if these are turned into the beam path with the help of the turntable 60. In both cases it is assumed that the projection light leaving the optical integrator 42 is at least substantially linearly polarized along the Y direction.

The birefringent optical element 70, which is located at the horizontal diameter of the member 68b shown in FIG. 5, has an optic axis 72 which is oriented along the Y direction. Consequently, the state of polarization of projection light passing through this optical element 70 is not affected. In FIG. 7 this is indicated by vertical lines at the vertical diameter of the distribution. However, with increasing distance from this vertical diameter the angle formed between the optic axis 72 and the Y direction increases. Consequently, the linear input state of polarization is transformed into an elliptical output state of polarization, wherein the ellipticity (i.e. the ratio of long to short half axis of the polarization ellipse) decreases with increasing distance from the vertical diameter. It is to be noted that the deviations from the linear state of polarization in FIG. 7 are considerably exaggerated for the sake of clarity. In a real apparatus 10 the deviations may be much smaller than shown in FIG. 7.

In the case of the polarization distribution shown in FIG. 8 and produced by the birefringent member 68d of FIG. 6, the ellipticity first decreases with increasing distance from the vertical diameter and then increases.

By comparing the polarization distributions shown in FIGS. 7 and 8 it becomes clear that the distribution of the ellipticity is symmetrical with respect to the vertical diameter which defines a plane of symmetry. However, this does not apply to the handedness of the elliptical output states of polarization. As it is indicated by small arrow heads in FIGS. 7 and 8, the handedness of the elliptical output states of polarization is opposite with respect to this plane of symmetry.

The other two birefringent members 68a and 68c produce polarization distributions which have still further ellipticity variations along the X direction.

Since the polarization adjustment device 58 is arranged in or in close vicinity to the pupil surface 38 of the illumination system 12, the polarization distributions exemplarily shown in FIGS. 7 and 8 will be imparted to the projection light such that each point on the illuminated field 14 on the mask 16 is subjected to the same polarization distribution. For example, if the turntable 60 is controlled by the control unit 66 such that the birefringent member 68b is inserted into the beam path, projection light having a plane of incidence parallel to the YZ direction will be linearly polarized, because it is not affected by the birefringent member 68b.

However, the larger the angles of incidence are in the XZ plane (i.e. the larger is the X coordinate in the pupil), the more the output state of polarization will differ from the linear input state of polarization. The projection exposure apparatus 10 is operated in the following manner:

In a first step image placement errors IPE associated with the image of the features 19 formed on the light sensitive surface 22 are determined. The image displacement errors IPE may be determined either by simulations or by measurements. Reference is made to the abovementioned essay of E. Hendrickx et al. entitled "*Image placement error: Closing the gap between overlay and imaging*". In this essay various approaches are described how the image placement error IPE can be determined.

In the embodiment shown in FIG. 2 is has been assumed that the determination of the image placement error IPE is performed computationally in a simulation unit 72. The simulation unit 72 is configured to determine the image placement errors IPE on the basis of input data relating to the pitch and orientation of the features 19 and to the illumination setting, which is produced by the spatial light modulator 36 to illuminate the mask 16. The simulation unit 72 may receive these data via the control unit 66 from an overall system control 74 which is represented in FIG. 2 as a computer and which is used to control the overall operation of the projection exposure apparatus 10.

The data relating to the pitch and orientation of the features 19 to be imaged on the light sensitive layer 22 are also used by the control unit 66 to determine which of the birefringent members 68a to 68d shall be inserted into the light path with the help of the turntable 60. To this end the control unit 66 computes which of the polarization distributions which can be produced by the birefringent members 68a to 68d best reduces the image placement errors IPE that have been determined before.

Once this selection is made by the control unit 66, the turntable 60 is operated and the selected birefringent member 68 is inserted into the beam path. The polarization distribution imparted by the inserted birefringent member 68 then reduces the image placement errors IPE on the wafer level. As will be shown in the following section V, an elliptical state of polarization of projection light converging towards an image point on the light sensitive surface 22 generally results in a displacement of the image point which may at least partly compensate an image placement error IPE associated with this particular image point.

V

IPE and Elliptical States of Polarization

In this section it will be explained in more detail how an elliptical state of polarization affects the placement of image points.

Figure 9:
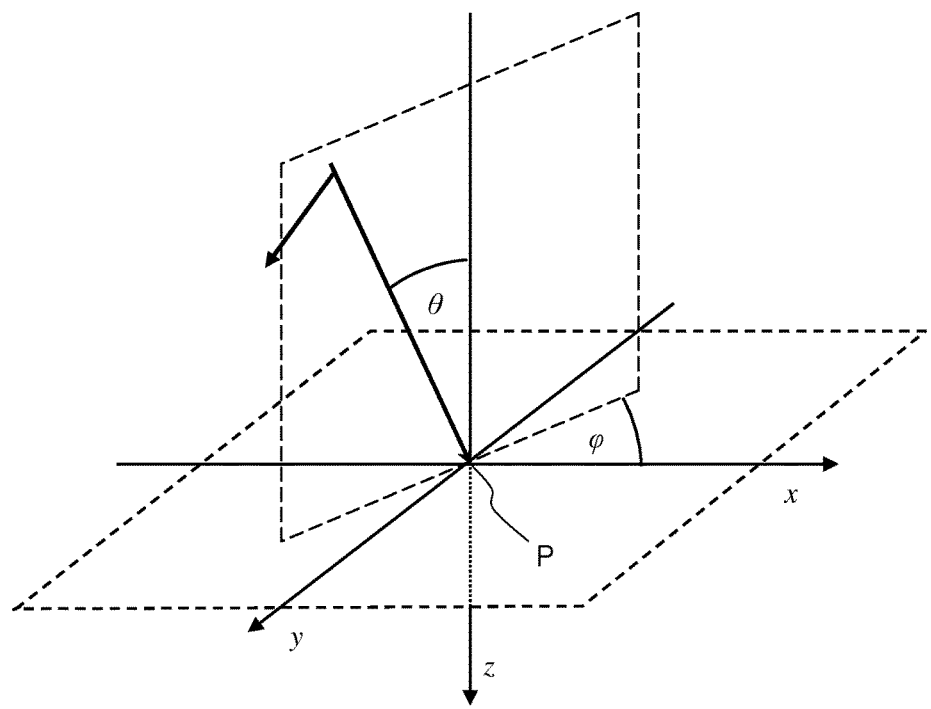
FIG. 9 illustrates several geometrical quantities that are used in the mathematical description of the effects exploited by the disclosure.

Reference is first made to FIG. 9 which illustrates several geometrical quantities that will be used in the following mathematical description. A position of a point P is defined by cartesian coordinates (x, y, z). E represents an electric field vector associated with a light wave, and $\hat{k}$ is a normalized direction vector of the light wave having the components $$\hat{k} = \begin{pmatrix} \hat{k}_x \\ \hat{k}_y \\ \hat{k}_z \end{pmatrix} \tag{2}$$

in the (x, y, z) basis. The normalized direction vector is related to the wave vector $k=(k_x,k_y,k_z)$ by $$k = \frac{2\pi n}{\lambda} \hat{k} \tag{3}$$

with n indicating the refractive index of the optical medium and $\lambda$ being the wavelength of the light wave. The normalized direction vector $\hat{k}$ may also be described by using polar coordinates with angles $\phi$ and $\theta$ as indicated in FIG. 9.

The Jones vector J which describes an elliptical state of polarization at the position (x, y, z) and which is associated with the light wave having the wave vector $k=(k_x,k_y,k_z)$ is given by $$J = \begin{pmatrix} \sin\Theta e^{i\Phi} \\ \cos\Theta \end{pmatrix} e^{\pm ik_x x + ik_y y + ik_z z} \tag{4}$$

The quantities $\Theta$ and $\Phi$ characterize the elliptical state of polarization in a manner that will be explained in more detail further below.

The electric field E in the image plane is then given by $$E = TJ \tag{5}$$

where T is a 3×2 transformation matrix that depends from the components of the normalized direction vector $\hat{k}$ according to equation (6):

$$T = \begin{pmatrix} \frac{\hat{k}_y^2 + \hat{k}_z \hat{k}_x^2}{1-\hat{k}_z^2} & \frac{\hat{k}_x \hat{k}_y (\hat{k}_z - 1)}{1-\hat{k}_z^2} \\ \frac{\hat{k}_x \hat{k}_y (\hat{k}_z - 1)}{1-\hat{k}_z^2} & \frac{\hat{k}_x^2 + \hat{k}_z \hat{k}_y^2}{1-\hat{k}_z^2} \\ -\hat{k}_x & -\hat{k}_y \end{pmatrix} \tag{6}$$

In the following the image formation at an image point in the image plane of the projection objective 20 will be considered. For the sake of simplicity some assumptions will be made, but without loss of generality. More particularly, it is assumed that vertical lines extending along they direction are imaged on the image plane that coincides with the xy plane in FIG. 9.

Figure 10:
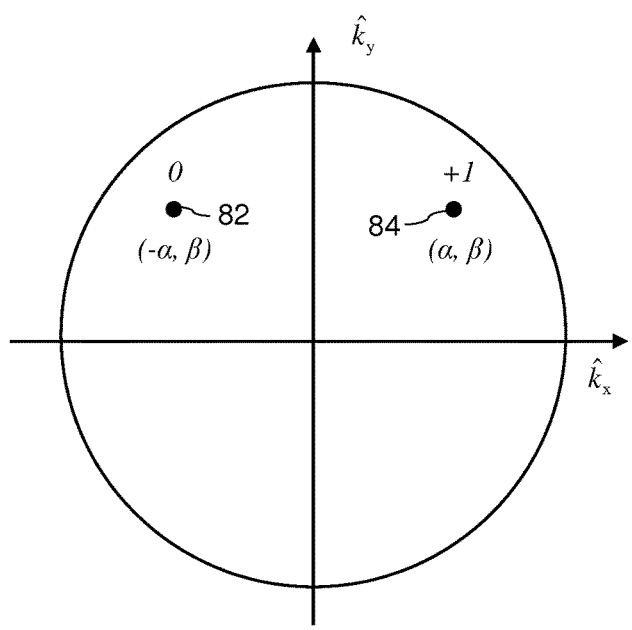
FIG. 10 illustrates the components of normalized direction vectors if two diffraction orders symmetrically arranged contribute to the image formation.
Figure 11:
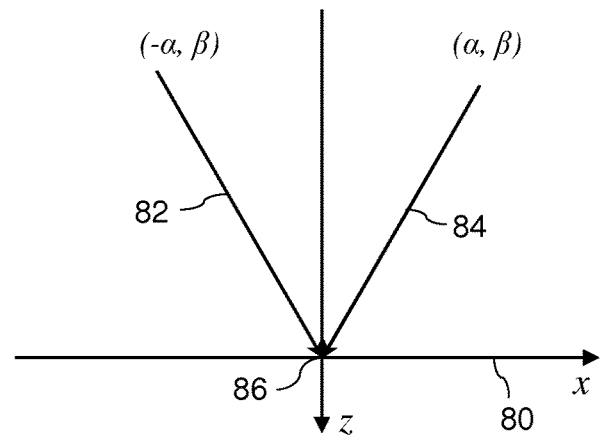
FIG. 11 shows how the two diffraction orders converge towards an image point.

It is furthermore assumed that these lines are illuminated by a monopole which is located in the pupil surface 38 in such a way that only the zeros and the first diffraction order contribute to the image formation. Additionally, it is assumed that these two diffraction orders impinge symmetrically on the image plane. For the normalized direction vector $\hat{k}$ this implies that if for one diffraction order the first component equals $\alpha$, the first component of the other diffraction order has to be $-\alpha$. This is illustrated in FIG. 10 which shows in a $(\hat{k}_x, \hat{k}_y)$ plane the first two components $\hat{k}_x = \alpha$ and $\hat{k}_y = \beta$ of the normalized direction vector $\hat{k}$ for the zero's diffraction order denoted by 82 and the first diffraction order denoted by 84. FIG. 11 illustrates in a projection along the y direction how the two diffraction orders 82, 84 converge towards an image point 86 in the image plane 80.

For the two diffraction orders 82, 84 propagating along directions $(\alpha, \beta, \gamma)$ and $(-\alpha, \beta, \gamma)$ the transformation matrix of equation (6) can be written as $$T_1(-\alpha, \beta) = \begin{pmatrix} A & -B \\ -B & C \\ \alpha & -\beta \end{pmatrix} \quad (7)$$

$$T_2(\alpha, \beta) = \begin{pmatrix} A & B \\ B & C \\ -\alpha & -\beta \end{pmatrix},$$

so that the electric fields $E_1$ and $E_2$ associated with the diffraction orders 82 and 84, respectively, are given by $$E_1 = T_1 J_1 = \begin{pmatrix} A\sin\Theta e^{i\Phi} - B\cos\Theta \\ -B\cos\Theta e^{i\Phi} + C\cos\Theta \\ \alpha\sin\Theta e^{i\Phi} - \beta\cos\Theta \end{pmatrix} e^{-ik_x x + ik_y y + ik_z z} \quad (8)$$

$$E_2 = T_2 J_2 = \begin{pmatrix} A\sin\Theta e^{i\Phi} + B\cos\Theta \\ B\sin\Theta e^{i\Phi} + C\cos\Theta \\ -\alpha\sin\Theta e^{i\Phi} - \beta\cos\Theta \end{pmatrix} e^{ik_x x + ik_y y + ik_z z}.$$

The intensity I at the image point 86 is obtained by coherently superimposing the electric fields $E_1$ and $E_2$ and subsequent computation of the square of the absolute value. Here we further assume that the light waves are only slightly elliptically polarized so that the deviation from a linear polarization along the y direction is small. This assumption is justified because an illumination with light that is perfectly linearly polarized along this direction enables the diffraction orders 82, 84 to interfere with maximum contrast. With this assumption only the y component $I_y$ of the intensity I will be significant. Using equation (8), it follows for this component:

$$I_y = |E_{1,y} + E_{2,y}|^2 \quad (9)$$

$$= \left| \begin{array}{c} (C\cos\Theta - B\sin\Theta e^{i\Phi})e^{-ik_x x + ik_y y + ik_z z} + \\ (C\cos\Theta + B\sin\Theta e^{i\Phi})e^{ik_x x + ik_y y + ik_z z} \end{array} \right|^2$$

$$I_y = |E_{1,y} + E_{2,y}|^2$$

$$= \left| \begin{array}{c} (C\cos\Theta - B\sin\Theta e^{i\Phi})e^{-ik_x x + ik_y y + ik_z z} + \\ (C\cos\Theta + B\sin\Theta e^{i\Phi})e^{ik_x x + ik_y y + ik_z z} \end{array} \right|^2$$

Figure 12:
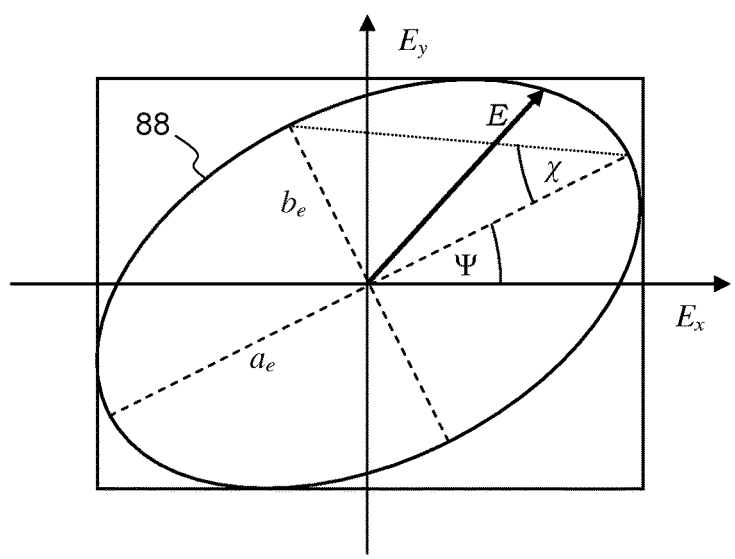
FIG. 12 is a polarization ellipse.

As it is generally known, any arbitrary state of polarization can be described using a polarization ellipse 88 as it is shown in FIG. 12. The polarization ellipse 88 has two principal axes $a_e, b_e$ whose ratio is defined as the ellipticity $\epsilon$ of the ellipse. The ellipticity $\epsilon$ is related to the angle $\chi$ according to $$\epsilon = \tan\chi \quad (10)$$

The angle $\Psi$ describes the orientation of the ellipse 88 in the coordinate system. The angle in equation (4) is related to the angles $\Psi$ and $\chi$ according to $$\tan 2\Psi = \frac{2\sin\Theta\cos\Theta}{\sin^2\Theta - \cos^2\Theta}\cos\Phi = -\tan 2\Theta\cos\Phi \quad (11)$$

$$\sin 2\chi = 2\sin\Theta\cos\Theta\sin\Phi = \sin 2\Theta\sin\Phi$$

Since we assume that the state of polarization does not deviate very much from a linear polarization along the y direction, the long principal axis $a_e$ of the polarization ellipse 88 also points along the y direction, and thus $\Psi=90°$. Then $\tan 2\Psi = 0$, and according to equation (11) the angle $\Phi$ is also be equal to 90°, since $\Theta$ is not equal to zero. From equation (9) $I_y$ can then be simplified to $$I_y = |(C\cos\Theta - iB\sin\Theta)e^{-ik_x x} + (C\cos\Theta + iB\sin\Theta)e^{ik_x x}|^2 \quad (12)$$

$$= |(P - iQ)e^{-ik_x x} + (P + iQ)e^{ik_x x}|^2$$

$$= 4(P\cos k_x x + Q\sin k_x x)^2$$

$$= 4(P^2\cos^2 k_x x + Q^2\sin^2 k_x x + 2PQ\cos k_x x\sin k_x x)$$

$$= 4(Q^2 + (P^2 - Q^2)\cos^2 k_x x + 2PQ\cos k_x x\sin k_x x)$$

$$= 4\left(Q^2 + (P^2 - Q^2)\frac{\cos 2k_x x + 1}{2} + PQ\sin 2k_x x\right)$$

$$= 2(P^2 + Q^2 + (P^2 - Q^2)\cos 2k_x x + 2PQ\sin 2k_x x)$$

$$= 2(P^2 + Q^2)(1 + \cos 2k_x(x - b)).$$

with $P = C \cos \Theta$ and $Q = B \sin \Theta$.

Thus a displacement b of the image point 86 occurs which is given by $$\tan 2k_x b = \frac{2PQ}{P^2 - Q^2} = \frac{2BC\cos\Theta\sin\Theta}{C^2\cos^2\Theta - B^2\sin^2\Theta} = \frac{2BC\sin 2\Theta}{(C^2 + B^2)\cos 2\Theta + C^2 - B^2} \quad (13)$$

For small $\Theta$, and if we expand B and C introduced in equation (7) into the coordinates $(\alpha, \beta, \gamma)$ and $(-\alpha, \beta, \gamma)$ describing the propagation directions of the two diffraction orders 82, 84, we obtain $$\tan 2k_x b \approx \frac{B}{C}\Theta = \frac{2\alpha\beta(\gamma - 1)}{\alpha^2 + \gamma\beta^2}\Theta \quad (14)$$

We now replace the cartesian coordinates $\alpha, \beta, \gamma$ by polar coordinates $\phi$ and $\theta$ according to $\alpha = \sin\theta\cos\phi$ $\beta = \sin\theta\sin\phi$ $\gamma = \cos\theta \quad (15)$ and we obtain for equation (14):

$$\tan 2k_x b = \frac{2\cos\phi\sin\phi(\cos\theta - 1)}{\cos^2\phi + \cos\theta\sin^2\phi}\Theta \quad (16)$$

-continued $$= \frac{2(\cos\theta - 1)\sin2\phi}{(1-\cos\theta)\cos2\phi + 1 + \cos\theta}\Theta$$

$$= \frac{-2\sin2\phi}{\cos2\phi + \frac{1+\cos\theta}{1-\cos\theta}}\Theta$$

$$= \frac{-2\sin2\phi}{\cos2\phi + \cot^2\frac{\theta}{2}}\Theta.$$

Figure 13:
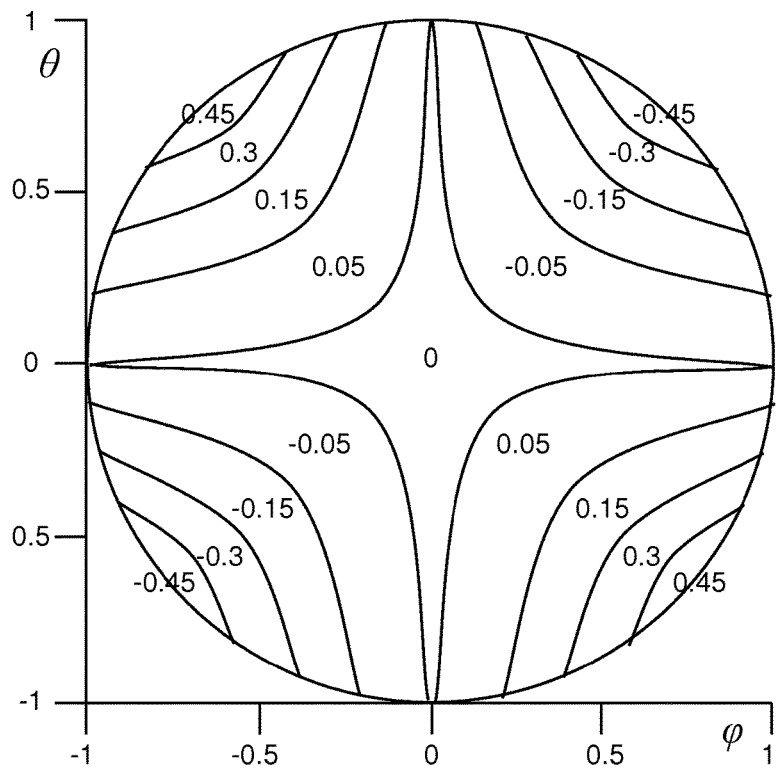
FIG. 13 is a graph illustrating the dependency of the displacement on the direction of incidence.

The factor $$f(\phi, \theta) = \frac{-2\sin2\phi}{\cos2\phi + \cot^2\frac{\theta}{2}} \quad (17)$$

is illustrated in the graph of FIG. 13. It can be seen that the displacement b vanishes for φ=0, i.e. for diffraction orders 82, 84 having a plane of incidence parallel to the xz plane. The maximum displacement b is obtained for directions at an angle of 45° or 135° with respect to the xz plane.

The displacement b thus depends on the direction of the light rays which contribute to the image formation in the image plane 80. These directions, in turn, depend on parameters such as pitch, size and orientation of the features to be imaged and the illumination setting produced by the spatial light modulator 36 of the illumination system 12. For a given mask 16 the parameters relating to the features are fixed, and usually there is little scope to depart from an illumination setting that has been found to be most suitable for imaging the mask 16. However, the parameter Θ which characterizes the polarization properties of the projection light can be freely varied at least to some extent, and thus it is possible, by suitably determining Θ, to produce a desired displacement b at mask level. This displacement b may be determined such that an image placement error IPE, which has been determined beforehand, is reduced. From Θ, in turn, the polarization ellipse 88 can be deducted according to equation (11), and a suitable birefringent member 68 can be inserted into the beam path with the help of the turntable 60.

Figures 14, 18:
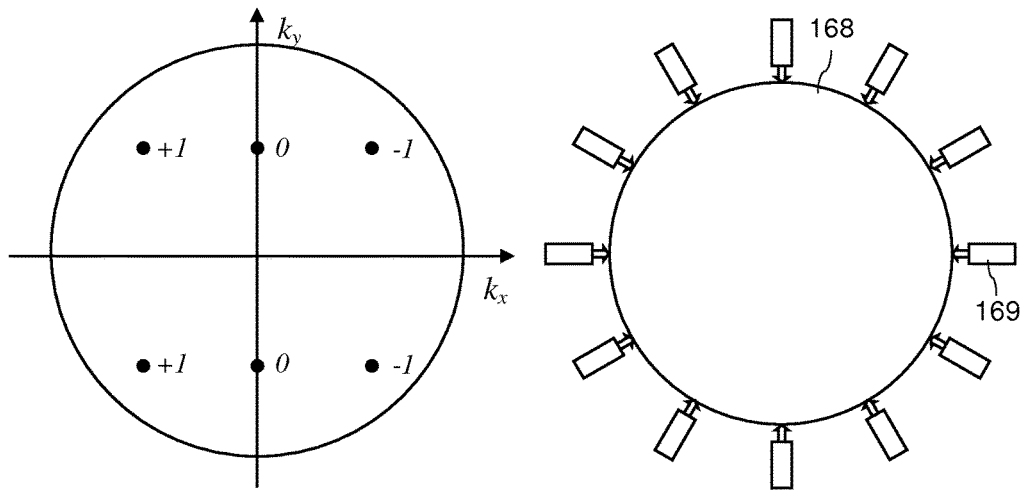
FIG. 14 illustrates the components of normalized direction vectors if six diffraction orders symmetrically arranged contribute to the image formation.
FIG. 18 is a top view of a birefringent plate used in the polarization adjustment device shown in FIG. 17.

In the foregoing it has been assumed that vertical lines extending along they direction are illuminated by a monopole. In the following it is assumed instead that a y dipole illumination setting is selected in which two poles are separated along they direction by a certain distance, and that there will be six diffraction orders which contribute to the image formation in the image plane 80. This is illustrated in FIG. 14 in which the diffraction orders associated with the two poles are denoted by +1, 0 and −1. If we now assume that the polarization distribution is uniform in the pupil surface 38, the upper three diffraction orders +1, 0 and −1 will produce a displacement +b along the x direction, whereas the three diffraction orders −1, 0 and +1 in the lower half of FIG. 14 will produce a displacement −b in the opposite direction. The two displacements +b and −b thus compensate each other so that the net effect is zero. From this it becomes clear that the handedness of the ellipticity in the upper half and lower half is not be identical in the two portions that are symmetrical to each other, as it has been explained above with reference to FIGS. 7 and 8. Only with opposite handedness the displacements will add and can be used to compensate an image displacement error IPE. The opposite sign of the handedness of the elliptical states of polarization is a condition that is always involved if there is a plane of symmetry in the pupil associated with the image point 86.

In the embodiment shown in FIGS. 1 to 8 it has been assumed that the polarization distributions produced by the birefringent members 68 vary only along they direction. However, the elliptical state of polarization may additionally vary along the x direction. Generally the distribution of the ellipticity in the pupil may itself be described by Zernike polynomials. For a y dipole only the odd Zernike polynomials of this expansion, for example $Z_3$, $Z_8$ or $Z_{11}$ and $Z_{20}$, are responsible for the displacement b, whereas for an x dipole the polynomials $Z_2$, $Z_7$ or $Z_{10}$ and $Z_{19}$ are responsible for the displacement b.

VI

Simulation

As it is becomes clear particularly from the graph shown in FIG. 13, the amount of the displacement b depends on the direction of the light which contributes to the image formation in the image plane 80.

Figure 15:
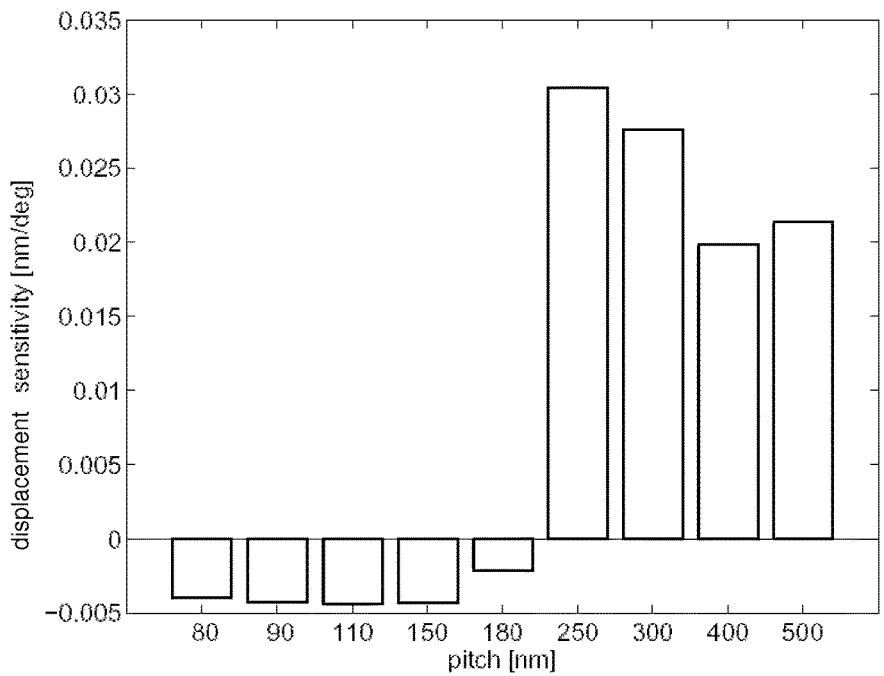
FIG. 15 is a graph showing the sensitivity of the displacement, which is produced by the elliptical output state of polarization, to the pitch of the features to be imaged for a C-quad illumination setting.
Figure 16:
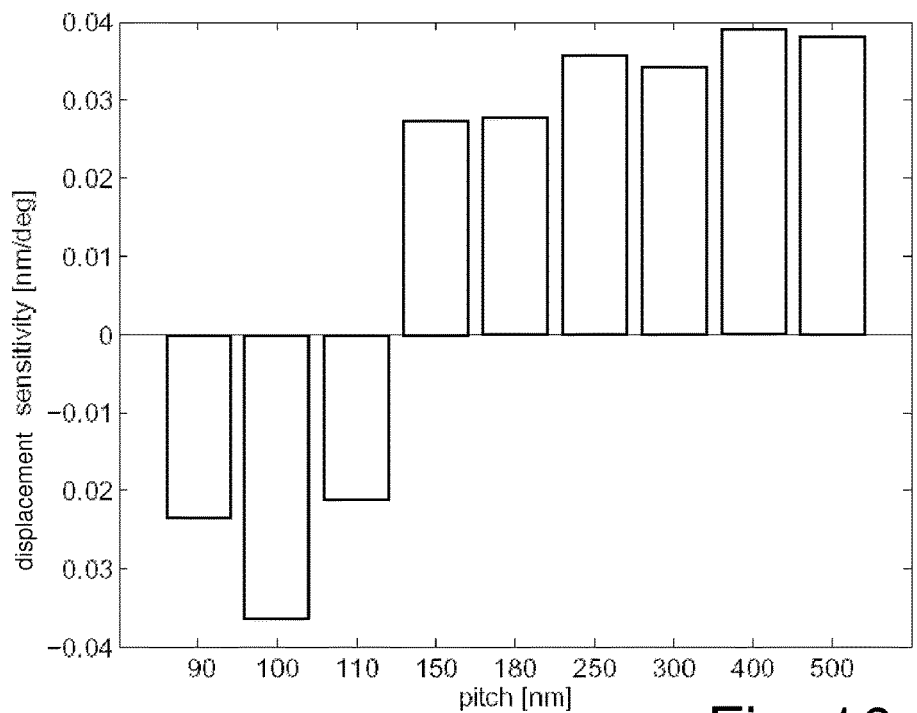
FIG. 16 is a graph similar as FIG. 15, but for an annular illumination setting.

The graphs of FIGS. 15 and 16 show the sensitivity of the displacement b as a function of the pitch for two different illumination settings, namely a C-quad illumination setting (FIG. 15) and an annular illumination setting (FIG. 16). The sensitivity is indicated as the ratio of the displacement b to the angle χ which is related to the ellipticity ε by equation (10).

In FIG. 15 it can be seen that for small pitches, i.e. a high density of the features 19 to be imaged, the IPE sensitivity is small. Thus the deviation from a linear state of polarization has to be large in order to obtain a significant displacement b. For pitches above 250 nm, however, the IPE sensitivity becomes so large that small deviations from the linear state of polarization suffice to obtain a significant displacement b. This effect can be explained, as mentioned above, from the location of the diffraction orders in the pupil, which are equivalent to the directions the projection light has when it converges towards an image point 86.

In the case of an annular illumination setting shown in FIG. 16, the IPE sensitivity is large for all pitches, but the sign of the sensitivity changes between a pitch of 110 nm and 150 nm.

VII

Alternative Embodiments

Figure 17:
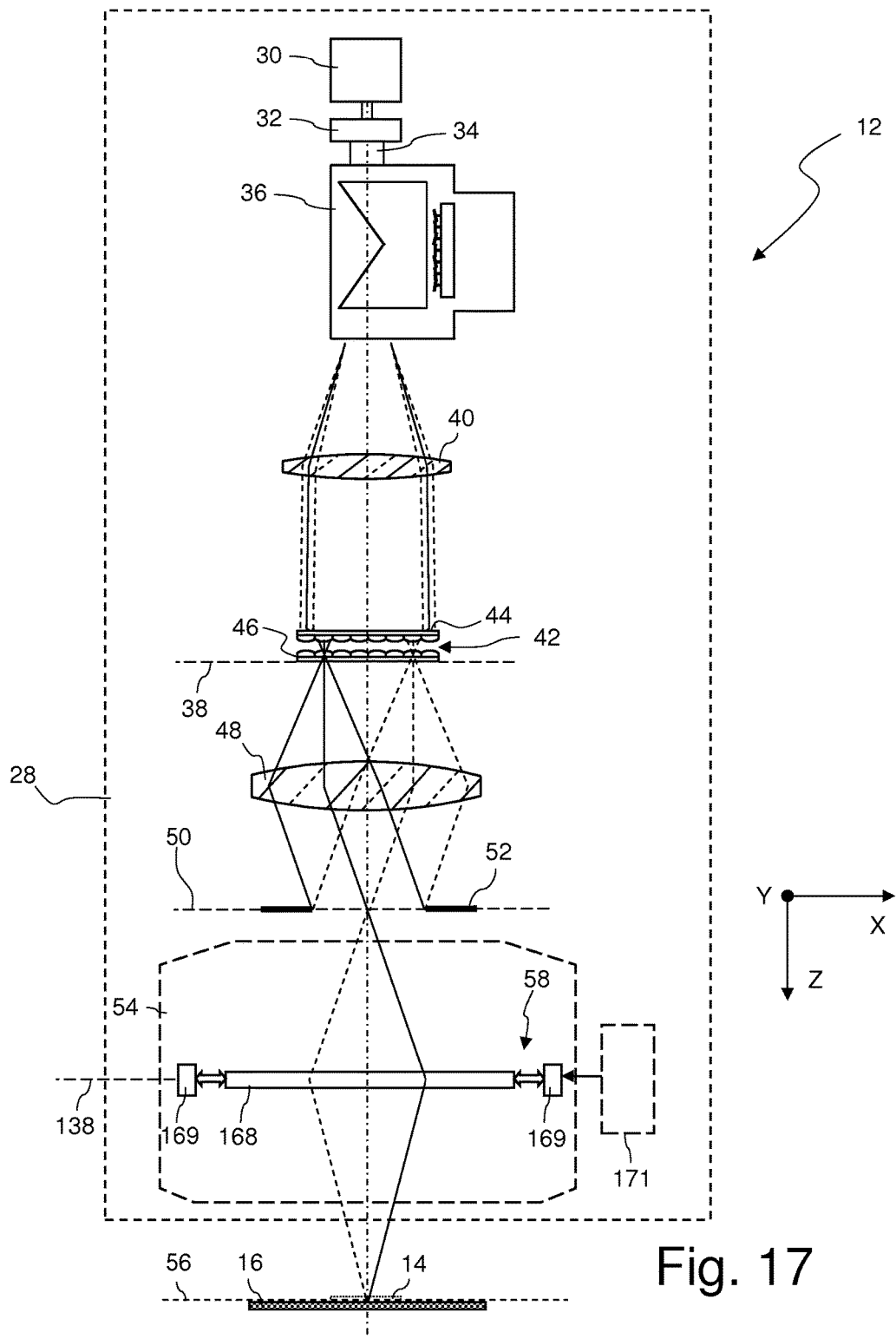
FIG. 17 is a meridional section similar to FIG. 2 for another embodiment of the disclosure in which a polarization adjustment device enabling a continuously varying polarization distribution is arranged in a pupil surface of a field stop objective.

FIG. 17 shows an illumination system 12 according to an alternative embodiment in a representation similar to FIG. 2. The illumination system 12 shown in FIG. 17 differs from the illumination system shown in FIG. 2 in two respects:

Firstly, the polarization adjustment device 58 of this embodiment is positioned not in or in close proximity to the pupil surface 38 immediately behind the optical integrator 42, but in or in close vicinity to a second pupil surface 138 which is located within the field stop objective 54 of the illumination system 12. Positioning the polarization adjustment device 58 at the second pupil surface 138 has the advantage that this position is closer to the mask 16, and consequently there are less optical elements which may adversely affect the polarization distribution which has been produced by the polarization adjustment device 58.

A second difference is that the polarization adjustment device 58 of the embodiment shown in FIG. 17 is capable of producing not only a limited set of different polarization distributions, but a continuous range of different polarization distributions. To this end the polarization adjustment device 58 includes a birefringent optical member 168 which is configured as a plane parallel plate having a circular circumference, as it is shown in the top view of FIG. 18. A plurality of actuators 169 are distributed along the circumference of the birefringent member 168. The actuators 169 are configured to produce a variable stress distribution within the birefringent optical member 168. To this end the actuators 169 are capable of producing pressure or tensile forces on the birefringent member 168. The actuators 169 are connected to a controller 171 which controls the actuators 169 in such a manner that a desired stress distribution is obtained within the birefringent optical member 168.

As a result of stress induced birefringence, the effect of the birefringent optical member 168 on the state of polarization varies locally in accordance with the stress distribution produced by the actuators 169. To produce polarization distributions having an opposite handedness with respect to a plane of symmetry, as it is shown in FIGS. 7 and 8, the birefringent optical member 168 may be assembled from two elements.

More details regarding the position-resolving polarization adjustment device 58 of the embodiment shown in FIG. 17 can be gleaned from WO 2005/031467 A2. This document discloses also some other polarization adjustment devices which may be used in the context of the present disclosure to produce the desired elliptical output states of polarization. In particular, the polarization adjustment device may include a sequence of two mutually rotated quarter-wave plates and one half-wave plate so that any desired output state of polarization can be produced irrespective of the input state of polarization. Then the projection light impinging on the polarization adjustment device does not necessarily have to be linearly polarized, but may be in other (defined) states of polarization as well.

Figure 19:
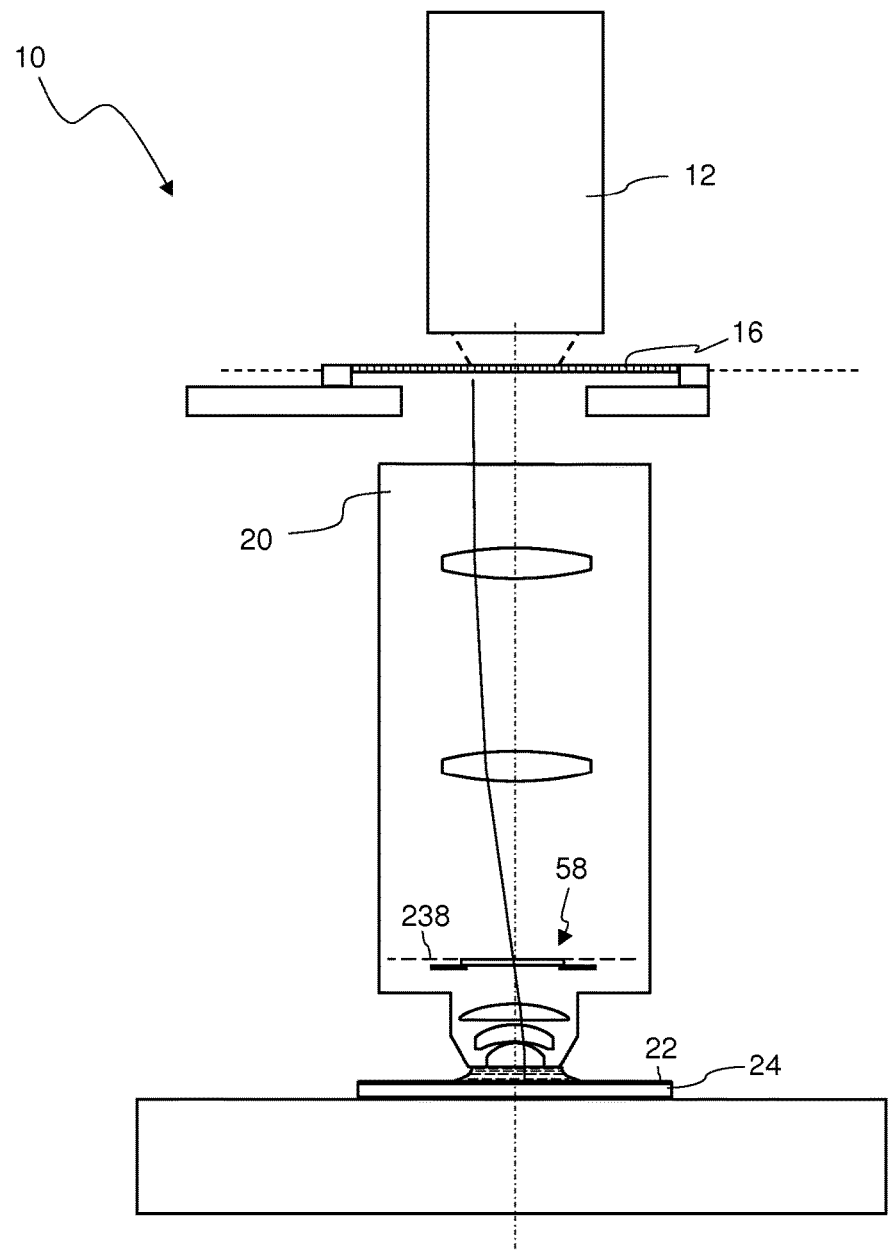
FIG. 19 is a schematic meridional section through a projection exposure apparatus according to another embodiment in which a polarization adjustment device is arranged in a pupil surface of the projection objective.

The reduction of the IPE is only possible if the elliptical output states of polarization produced by the polarization adjustment device 58 are not significantly disturbed by the mask 16 or any other optical elements arranged between the polarization adjustment device 58 and the light sensitive surface 22. If this assumption is not correct, for example because the mask 16 has a significant polarizing effect which at least partly destroys the elliptical output states of polarization, the polarization adjustment device 58 may be arranged within the projection objective 20, as it is shown in the schematic meridional section of FIG. 19. There the polarization adjustment device 58 in accordance with the present disclosure is not arranged within the illumination system 12, but in or in close vicinity to a pupil surface 238 which is located within the projection objective 20.

Sometimes the IPE has a field dependency that cannot be neglected. In apparatus of the scanner type the illuminated field 14 has short dimensions along the scan direction Y (see FIG. 1) and long dimensions along the perpendicular X direction. The IPE then varies significantly only along the X direction.

If a field dependency of the IPE cannot be tolerated, the polarization adjustment device 58 is capable to modify the state of polarization in a field dependent manner. This may be accomplished, for example, with a polarization adjustment device 58 that includes not only birefringent optical members that can be inserted into the pupil surface 38, but also at least one additional birefringent member that is positioned in (or can be inserted into) a field plane of the apparatus. This additional birefringent member then addresses only the field dependency of the IPE. This field plane may be the intermediate field plane 50 of the illumination system 12, a plane immediately adjacent the mask plane 56 or an intermediate image plane in the projection objective 20.

VIII

Important Method Steps

Figure 20:
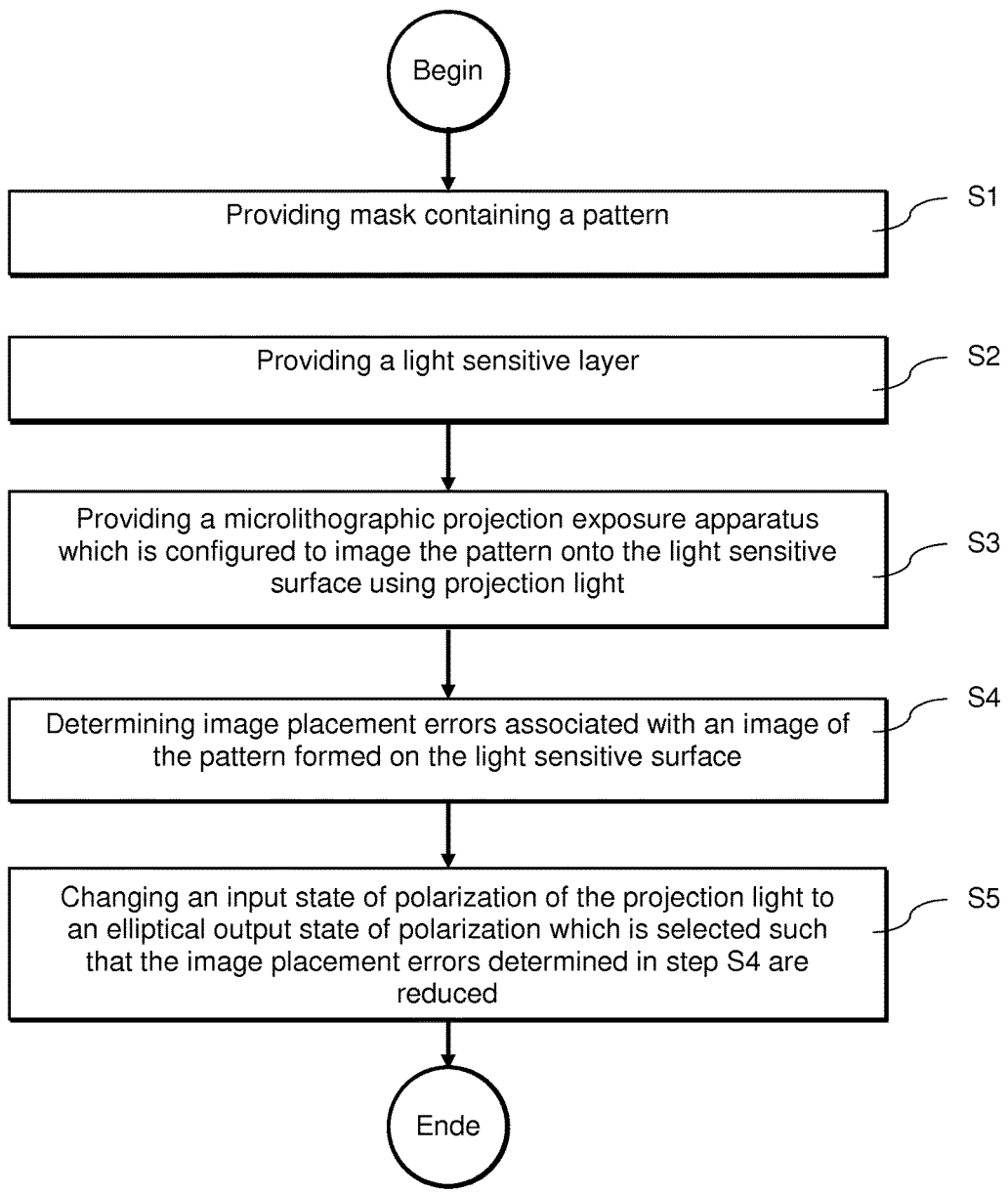
FIG. 20 is a flow diagram illustrating important steps of the method of reducing image placement errors in accordance with the present disclosure.

In the following important method steps will be summarized with reference to the flow diagram shown in FIG. 20.

In a first step S1 a mask containing features is provided.

In a second step S2 a light sensitive layer is provided.

In a third step S3 a microlithographic projection exposure apparatus is provided which is configured to image the features onto the light sensitive surface using projection light.

In a fourth step S4 image placement errors associated with an image of the features formed on the light sensitive surface are determined.

In a fifth step S5 an input state of polarization of the projection light is changed to an elliptical output state of polarization which is selected such that the image placement errors determined in step S4 are reduced.

What is claimed is:

1. An optical system of a microlithographic projection exposure apparatus, the optical system comprising:
   a) a polarization adjustment device which is capable of changing an input state of polarization to different elliptical output states of polarization, and
   b) a control unit which controls the polarization adjustment device, wherein the control unit is configured:
      to receive data relating to image placement errors occurring at a light sensitive surface on which features contained in a mask are imaged, and
      to select the elliptical output state of polarization produced by the polarization adjustment device such that the image placement errors are reduced,
   wherein the image placement errors comprise absolute lateral displacements of an actual feature image from its ideal placement.

2. The system of claim 1, wherein the elliptical output state of polarization varies depending on the direction of the projection light when it converges towards a point on the light sensitive surface.

3. The system of claim 2, wherein the control unit is configured to: a) receive data relating to the pitch and orientation of the features to be imaged on the light sensitive layer; and b) select the elliptical output state of polarization depending on the pitch and orientation.

4. The system of claim 2, comprising a simulation unit which is configured to determine the image placement errors on the basis of input data relating to: a) the pitch and orientation of the features; b) an illumination setting used to illuminate the mask.

5. The system of claim 2, wherein the polarization adjustment device comprises a birefringent optical member.

6. The system of claim 1, wherein the control unit is configured to: a) receive data relating to the pitch and orientation of the features to be imaged on the light sensitive layer; and b) select the elliptical output state of polarization depending on the pitch and orientation.

7. The system of claim 6, comprising a simulation unit which is configured to determine the image placement errors on the basis of input data relating to: a) the pitch and orientation of the features; b) an illumination setting used to illuminate the mask.

8. The system of claim 6, wherein the polarization adjustment device comprises a birefringent optical member.

9. The system of claim 1, comprising a simulation unit which is configured to determine the image placement errors on the basis of input data relating to: a) the pitch and orientation of the features; b) an illumination setting used to illuminate the mask.

10. The system of claim 1, wherein the polarization adjustment device is arranged in or in close vicinity to a pupil surface of the optical system.

11. The system of claim 1, wherein the optical system is an illumination system or a projection objective of the apparatus.

12. The system of claim 1, wherein the polarization adjustment device comprises a birefringent optical member.

13. The system of claim 12, wherein the polarization adjustment device comprises an actuator that is configured to produce a variable stress distribution within the birefringent optical member.

14. The system of claim 12, wherein the polarization adjustment device comprises an exchange mechanism that is configured to insert one of a plurality of different birefringent optical members into a projection light beam path of the optical system.

15. The system of claim 14, wherein each optical member comprises a plurality of uniaxial birefringent optical elements, wherein the optic axis of at least two of the plurality of optical elements have different orientations.

16. A method of reducing image placement errors in a microlithographic projection exposure apparatus, comprising the following steps:

a) providing a mask containing features;
b) providing a light sensitive layer;
c) providing a microlithographic projection exposure apparatus which is configured to image the features onto the light sensitive surface using projection light;
d) determining image placement errors associated with an image of the features formed on the light sensitive surface;
e) changing an input state of polarization of the projection light to an elliptical output state of polarization which is selected such that the image placement errors determined in step d) are reduced, wherein the image placement errors comprise absolute lateral displacements of an actual feature image from its ideal placement.

17. The method of claim 16, wherein the output elliptical state of polarization is selected in step e) depending on the pitch and the orientation of the features to be imaged.

18. The method of claim 16, wherein the elliptical output state of polarization varies depending on the direction of the projection light when it converges towards a point on the light sensitive surface.

19. The method of claim 16, wherein an intensity distribution in a pupil surface of an illumination system of the apparatus is symmetrical with regard to a plane of symmetry, and wherein a distribution of the handedness of the elliptical output states of polarization in this pupil surface is non-symmetrical with respect to the plane of symmetry.

20. The method of claim 16, wherein the state of polarization of the projection light is changed before the projection light impinges on the mask.

* * * * *

UNITED STATES PATENT AND TRADEMARK OFFICE
CERTIFICATE OF CORRECTION

PATENT NO. : 9,785,052 B2
APPLICATION NO. : 13/792599
DATED : October 10, 2017
INVENTOR(S) : Johannes Ruoff et al.

Page 1 of 1

It is certified that error appears in the above-identified patent and that said Letters Patent is hereby corrected as shown below:

In the Specification

Column 3, Line 4, delete "Zermike" and insert -- Zernike --.

Column 6, Line 34, delete "is is" and insert -- is --.

Column 13, Line 3, delete " $\hat{k}_x = \beta$ " and insert -- $\hat{k}_y = \beta$ --.

Signed and Sealed this
Twentieth Day of February, 2018

Andrei Iancu
*Director of the United States Patent and Trademark Office*